(12) United States Patent
Lin et al.

(10) Patent No.: US 12,362,227 B2
(45) Date of Patent: Jul. 15, 2025

(54) METHOD FOR IMPROVING PROFILE OF INTERCONNECT STRUCTURE

(71) Applicant: TAIWAN SEMICONDUCTOR MANUFACTURING COMPANY, LTD., Hsinchu (TW)

(72) Inventors: Chun-Neng Lin, Hsinchu (TW); Jian-Jou Lian, Hsinchu (TW); Chieh-Wei Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 434 days.

(21) Appl. No.: 17/841,901

(22) Filed: Jun. 16, 2022

(65) Prior Publication Data

US 2023/0411206 A1 Dec. 21, 2023

(51) Int. Cl.
*H01L 21/768* (2006.01)
*H01L 21/311* (2006.01)
*H01L 23/522* (2006.01)
*H10D 30/01* (2025.01)

(52) U.S. Cl.
CPC .. *H01L 21/76802* (2013.01); *H01L 21/31111* (2013.01); *H01L 21/76877* (2013.01); *H01L 23/5226* (2013.01); *H10D 30/0241* (2025.01)

(58) Field of Classification Search
CPC ......... H01L 21/76802; H01L 21/76877; H01L 23/5226; H01L 21/76804; H01L 21/76831; H01L 29/66803; H01L 21/76825; H10D 30/0241
See application file for complete search history.

(56) References Cited

U.S. PATENT DOCUMENTS

| | | | |
|---|---|---|---|
| 6,184,126 B1* | 2/2001 | Lee | H01L 21/31155 438/653 |
| 2015/0270156 A1* | 9/2015 | Lin | H01L 21/76843 438/618 |
| 2016/0111324 A1* | 4/2016 | Chiu | H01L 21/76813 438/653 |
| 2019/0221475 A1* | 7/2019 | Hong | H01L 21/76831 |
| 2021/0134660 A1* | 5/2021 | Wang | H01L 21/76825 |
| 2021/0193513 A1* | 6/2021 | Tien | H01L 23/5226 |
| 2022/0352017 A1* | 11/2022 | Tien | H01L 21/76831 |
| 2023/0290678 A1* | 9/2023 | Hsueh | H01L 21/76895 |

* cited by examiner

*Primary Examiner* — Bac H Au
(74) *Attorney, Agent, or Firm* — Birch, Stewart, Kolasch & Birch, LLP (57) ABSTRACT

A method for manufacturing a semiconductor device includes: forming a patterned dielectric layer over a substrate, the patterned dielectric layer including an interconnect opening having a sidewall surface and a bottom surface; and forming a doped film by an opening-adjustment process, the doped film being disposed on the patterned dielectric layer and extending into the interconnect opening to cover an upper portion of the sidewall surface, so as to adjust a profile of the interconnect opening.

20 Claims, 9 Drawing Sheets

METHOD FOR IMPROVING PROFILE OF INTERCONNECT STRUCTURE

BACKGROUND

In semiconductor manufacturing, interconnect structures are formed in an interconnect layer of a semiconductor device, and an etching process is used for forming interconnect openings of the interconnect layer. While semiconductor devices are continuously scaled down with the advancement of technology, the etching process becomes more challenging due to critical etching profile requirements for the interconnect openings. Ideal profiles of the interconnect openings should have a straight sidewall. However, in reality, the profiles of the interconnect openings are often formed in a tapered shape due to process variations, such as operation parameters of manufacturing apparatus of the semiconductor devices. Therefore, the interconnect structures formed by filling a conductive material into the interconnect openings in the tapered shape may have a bridging risk, which may cause a short circuit between the interconnect structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "upwardly," "upward," "upper," "lower," "bottom," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
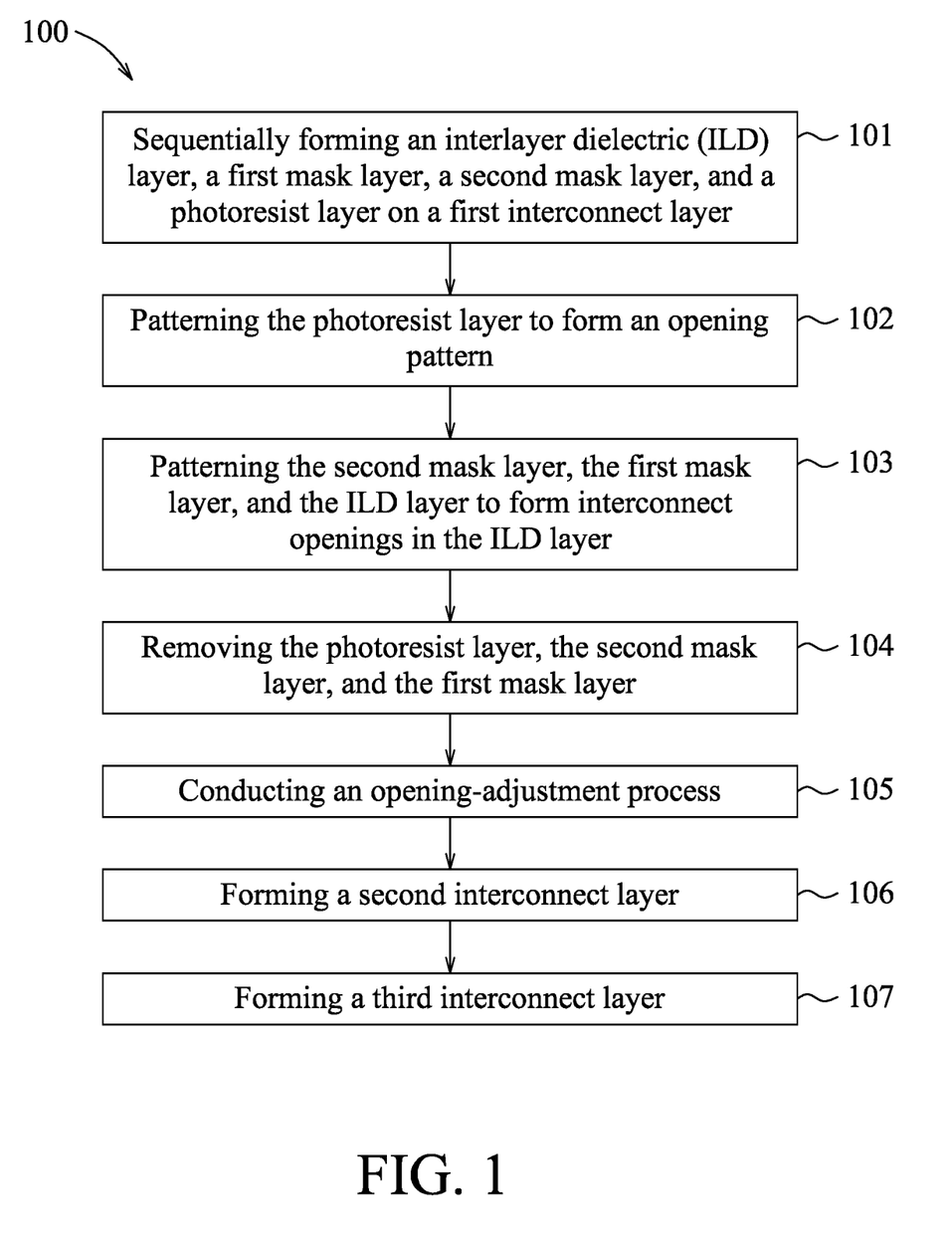
FIG. 1 is a flow diagram illustrating a method for manufacturing a semiconductor device in accordance with some embodiments.
Figure 13:
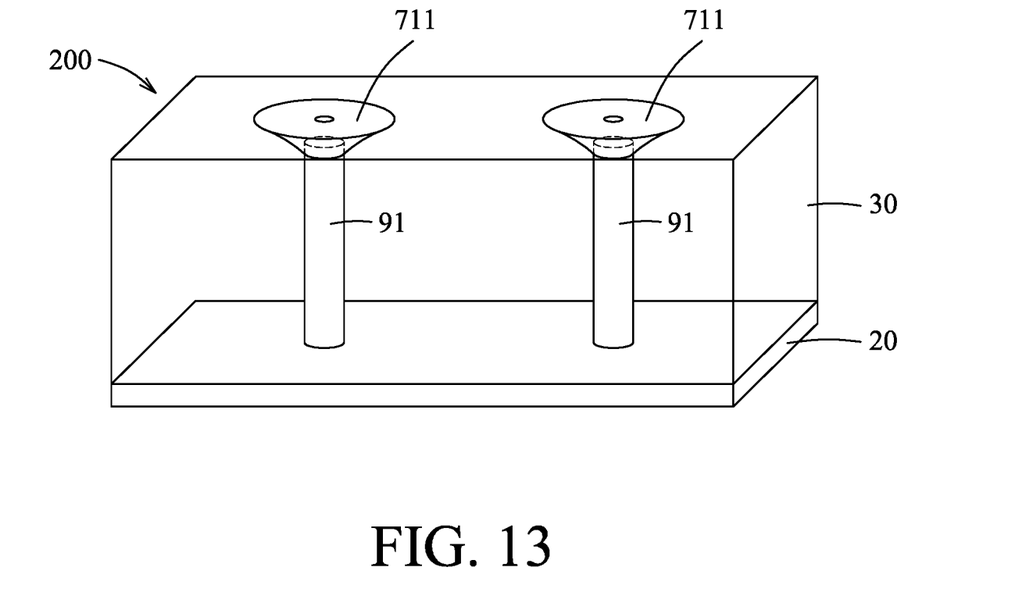
FIG. 13 is a schematic perspective view illustrating an intermediate stage of the manufacturing method as depicted in FIG. 1 in accordance with some embodiments.
Figure 14:
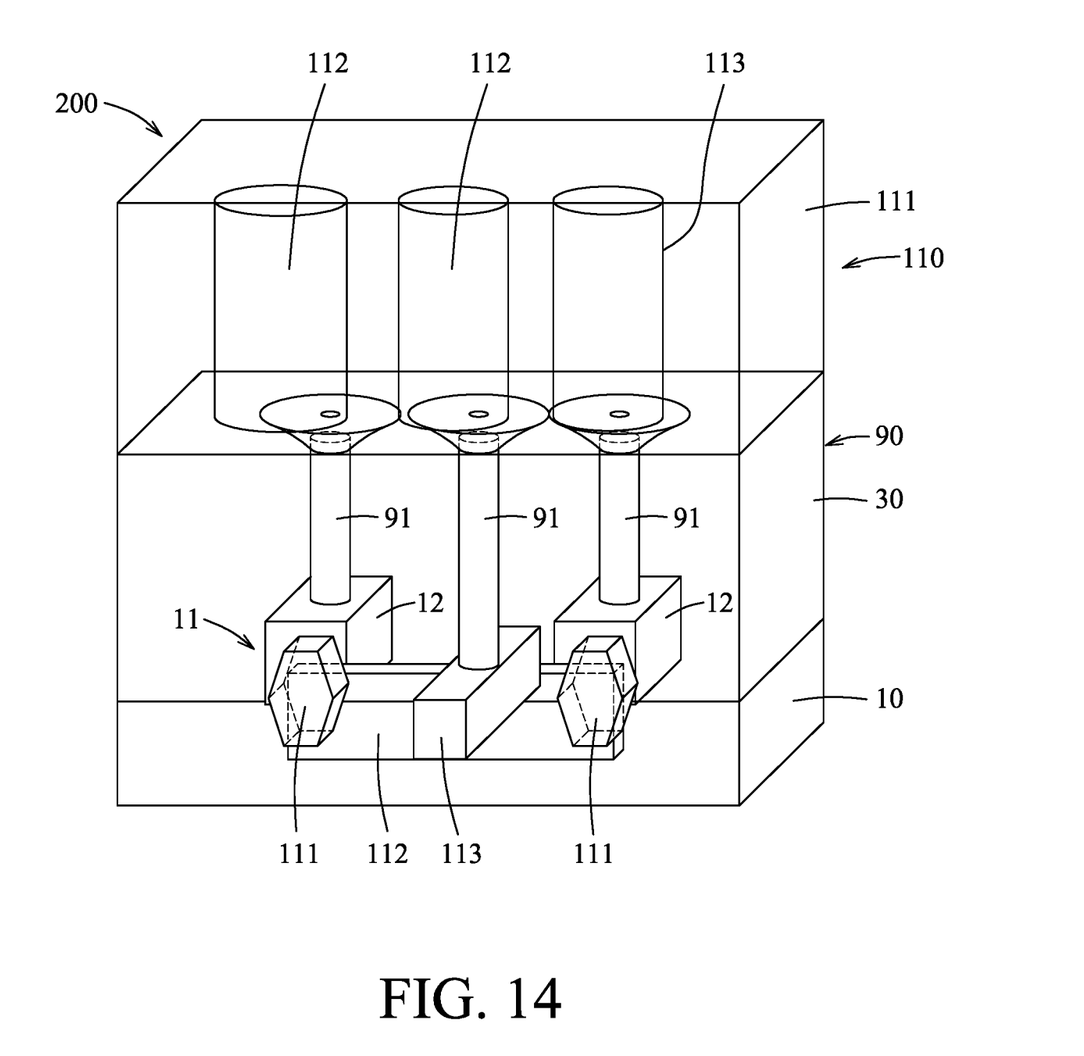
FIG. 14 is a schematic perspective view illustrating an intermediate stage of the manufacturing method as depicted in FIG. 1 in accordance with some embodiments.

The present disclosure is directed to a method for manufacturing a semiconductor device, in which profiles of interconnect openings are adjusted by an opening-adjustment process so as to improve profiles of interconnect structures formed by filling a conductive material into the interconnect openings. FIG. 1 illustrates a method 100 for manufacturing a semiconductor device in accordance with some embodiments. FIGS. 2 to 10 are schematic views of a semiconductor device 200 at some intermediate stages of the manufacturing method as depicted in FIG. 1 in accordance with some embodiments. In addition, FIGS. 13 and 14 are schematic perspective views of the semiconductor device 200 at some intermediate stages of the manufacturing method as depicted in FIG. 1 in accordance with some embodiments. Additional steps can be provided before, after or during the method 100, and some of the steps described herein may be replaced by other steps or be eliminated. Similarly, further additional features may be present in the semiconductor device 200, and/or features present may be replaced or eliminated in additional embodiments.

Figure 2:
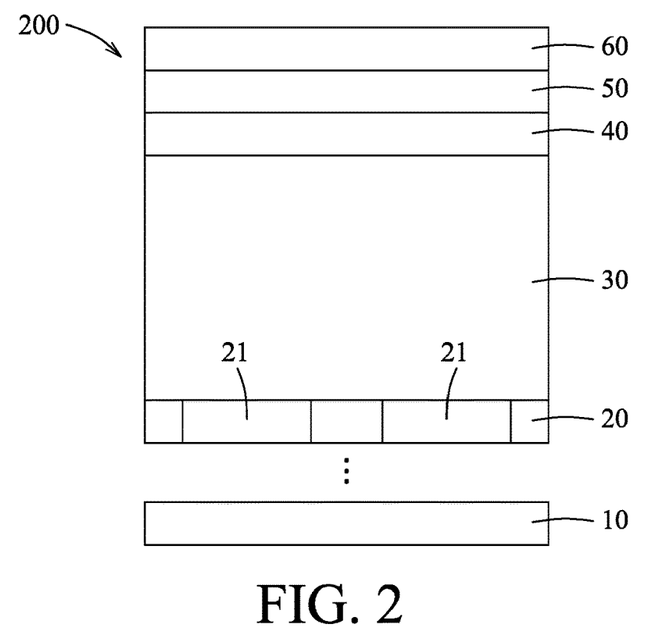
FIGS. 2 to 10 are schematic views illustrating some intermediate stages of the manufacturing method as depicted in FIG. 1 in accordance with some embodiments.

Referring to FIG. 1 and the example illustrated in FIG. 2, the method 100 begins at step 101, where an interlayer dielectric layer, a first mask layer, a second mask layer, and a photoresist layer are formed sequentially on a first interconnect layer disposed over a substrate. FIG. 2 is a schematic view illustrating sequential formation of an interlayer dielectric (ILD) layer 30, a first mask layer 40, a second mask layer 50, and a photoresist layer 60 on a first interconnect layer 20 disposed over a substrate 10.

In some embodiments, the substrate 10 is a semiconductor substrate which may include, for example, but not limited to, an elemental semiconductor or a compound semiconductor. An elemental semiconductor includes a single species of atoms, such as silicon (Si) or germanium (Ge) in column XIV of the periodic table, and may be in crystal, polycrystalline, or an amorphous form. Other suitable materials are within the contemplated scope of the present disclosure. A compound semiconductor includes two or more elements, and examples thereof may include, but not limited to, silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and gallium indium arsenide phosphide (GaInAsP). Other suitable materials are within the contemplated scope of the present disclosure. The compound semiconductor may have a gradient feature in which the compositional ratio thereof changes from one location to another location therein. The compound semiconductor may be formed over a silicon substrate. The compound semiconductor may be strained. In some embodiments, the semiconductor substrate may include a multilayer compound semiconductor structure. In some embodiments, the semiconductor substrate may be a semiconductor on insulator (SOI) (e.g., silicon germanium on insulator (SGOI)). Generally, an SOI substrate includes a layer of a semiconductor material such as epitaxial silicon, germanium, silicon germanium, or combinations thereof. Other suitable materials are within the contemplated scope of the present disclosure. The SOI substrate may be doped with a P-type dopant, for example, but not limited to, boron (Br), aluminum (Al), or gallium (Ga). Other suitable materials are within the contemplated scope of the present disclosure. Alternatively, the SOI substrate may be doped with an N-type dopant, for example, but not limited to, nitrogen (N), phosphorus (P), or arsenic (As). Other suitable materials are within the contemplated scope of the present disclosure. In some embodiments, the semiconductor substrate may further include various active regions, for example, the active regions configured for an N-type metal oxide semiconductor (NMOS) transistor device or the active regions configured for a P-type metal oxide semiconductor (PMOS) transistor device. In some embodiments, the active regions may includes source/drain (S/D) regions of a transistor device. It is noted that each of the source/drain regions may refer to a source or a drain, individually or collectively dependent upon the context.

The first interconnect layer 20 includes a plurality of first interconnect structures 21 spaced apart from each other. In some embodiments, the first interconnect layer 20 serves as a metal layer and each of the first interconnect structures 21 serves as a metal line. In some embodiments, the first interconnect layer 20 serves as a via layer and each of the first interconnect structures 21 serves as a metal contact (for example, a metal contact 12 shown in FIG. 14) disposed on and electrically connected to, for example, a corresponding one of the source/drain (S/D) regions (for example, source/drain (S/D) regions 111 shown in FIG. 14).

In some embodiments, the ILD layer 30 may include a dielectric material, for example, but not limited to, silicon oxide (SiOx), silicon nitride (SiNx), silicon carbide (SiCx), silicon oxycarbide (SiOxCy), silicon oxynitride (SiOxNy), hydrogenated silicon oxycarbide (SiOxCyHz), spin-on glass (SOG), amorphous fluorinated carbon, fluorinated silica glass (FSG), Xerogel, Aerogel, polyimide, Parylene, BCB (bis-benzocyclobutenes), Flare, SiLK (Dow Chemical Co., Midland, Mich.), non-porous materials, porous materials, other low-k dielectric materials, or combinations thereof. Other suitable materials are within the contemplated scope of the present disclosure. In some embodiments, the ILD layer 30 may be formed on the first interconnect layer 20 by a suitable deposition process as is known in the art of semiconductor fabrication, such as physical vapor deposition (PVD), chemical vapor deposition (CVD), atomic layer deposition (ALD), plasma-enhanced ALD (PEALD), thermal ALD, plasma-enhanced CVD (PECVD), or the like. Other suitable techniques are within the contemplated scope of the present disclosure.

The first mask layer 40 is formed on the ILD layer 30 to provide a substantially planar upper surface. In some embodiments, the first mask layer 40 may include, for example, but not limited to, an organic polymeric material containing carbon, hydrogen, and oxygen; an inorganic material; or a combination thereof. In some embodiments, the inorganic material may include, for example, but not limited to, silicon oxide, silicon nitride, silicon carbide, silicon oxycarbide, silicon oxynitride, silicon carbonitride, silicon oxycarbonitride, tungsten nitride, tungsten carbide, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, or combinations thereof. Other suitable materials are within the contemplated scope of the present disclosure. The first mask layer 40 may be formed on the ILD layer 30 by a suitable deposition process as is known in the art of semiconductor fabrication, such PVD, CVD, ALD, PEALD, thermal ALD, PECVD, or the like. Other suitable techniques are within the contemplated scope of the present disclosure.

The second mask layer 50 is then formed on the first mask layer 40. The material and the process for forming the second mask layer 50 may be the same as or similar to the material and the process for forming the first mask layer 40 described above, and the details thereof are omitted for the sake of brevity.

The photoresist layer 60 is then formed on the second mask layer 50 by a suitable fabrication technique known to those skilled in the art of semiconductor fabrication. In some embodiments, the photoresist layer 60 may be formed on the second mask layer 50 by a spin-on technique. Other suitable techniques are within the contemplated scope of the present disclosure.

Figure 3:
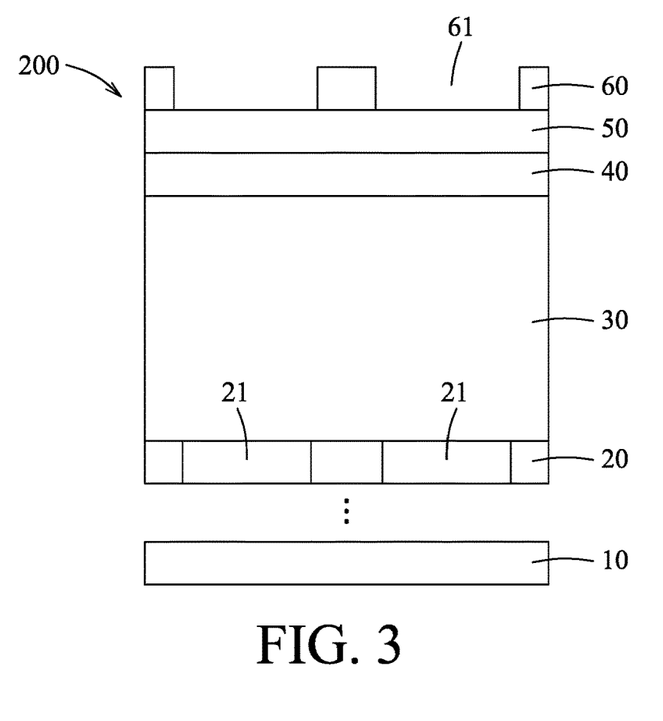

Referring to FIG. 1 and the example illustrated in FIG. 3, the method 100 proceeds to step 102, where the photoresist layer is patterned to form an opening pattern.

FIG. 3 is a schematic view illustrating formation of an opening pattern 61 in the photoresist layer 60. The photoresist layer 60 may be patterned using a suitable photolithography technique and a photoresist developing technology to form the opening pattern 61 in the photoresist layer 60. In some embodiments, the photoresist layer 60 is patterned through a pattern of a patterned mask (not shown) using well-known photolithographic processes, for example, but not limited to, high resolution deep ultraviolet (DUV) photolithography for optimum pattern resolution. In some embodiments, the photoresist layer 60 is exposed to light having a predetermined wavelength through the pattern of the patterned mask. The pattern of the patterned mask is thus transferred to the photoresist layer 60. The photoresist layer 60 after the exposure is heated or baked for a time period. A developer solution is then applied to the photoresist layer 60. The developer solution may be applied in a number of ways, for example, dripping the developer solution onto the photoresist layer 60, dipping the semiconductor device 200 into a developer solution bath, or spraying the developer solution onto the photoresist layer 60. A portion of the photoresist layer 60, which is soluble in the developer solution, is removed to form the opening pattern 61 in the photoresist layer 60. An optional baking process may be performed to remove any residual moisture on the photoresist layer 60.

Figure 4:
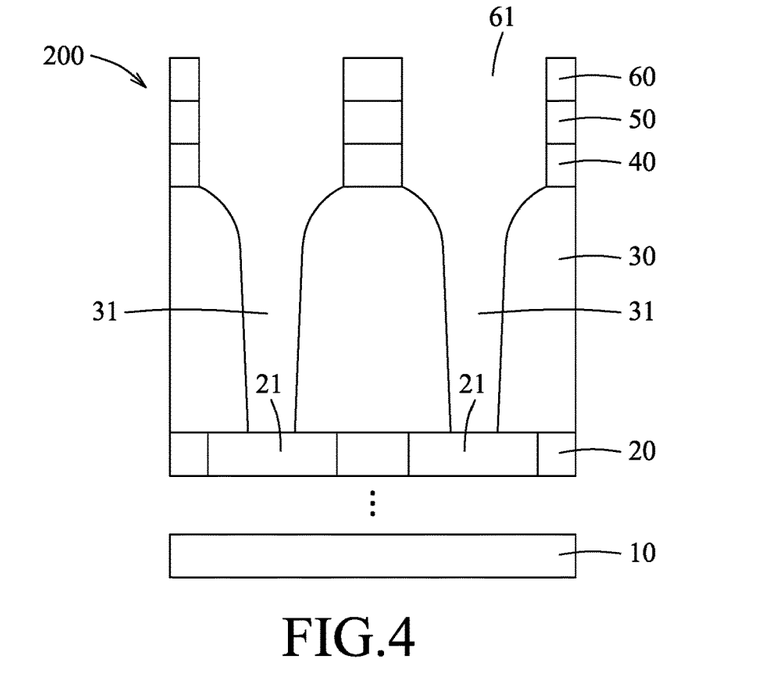

Referring to FIG. 1 and the example illustrated in FIG. 4, the method 100 proceeds to step 103, where the second mask layer, the first mask layer, and the ILD layer are patterned to form a plurality of interconnect openings in the ILD layer. FIG. 4 is a schematic view illustrating formation of a plurality of interconnect openings 31 in the ILD layer 30. In some embodiments, The opening pattern 61 formed in the photoresist layer 60 is sequentially transferred to the second mask layers 50, the first mask layer 40, and the ILD layer 30 using one or more etching processes to form a plurality of the interconnect openings 31 in the ILD layer 30. The interconnect openings 31 are spaced apart from each other. In some embodiments, the opening pattern 61 formed in the photoresist layer 60 is sequentially transferred to the second mask layers 50, the first mask layer 40, and the ILD layer 30 using an anisotropic etching process, for example, but not limited to, a dry plasma etching process, or the like. Other suitable techniques are within the contemplated scope of the present disclosure.

Figure 5:
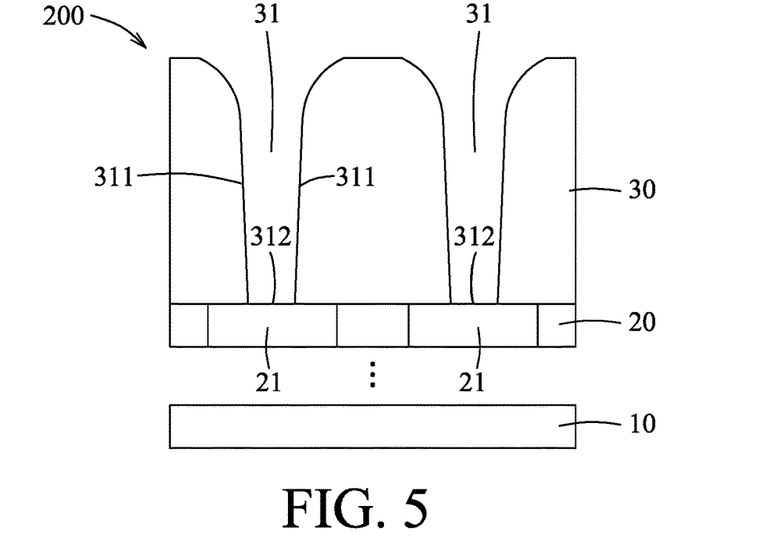

Referring to FIG. 1 and the examples illustrated in FIGS. 4 and 5, the method 100 proceeds to step 104, where the photoresist layer, the second mask layer, and the first mask layer are removed. In some embodiments, the photoresist layer 60, the second mask layer 50, and the first mask layer 40 may be removed using an ashing process. In some embodiments, the ashing process may be conducted at a temperature ranging from about 100° C. to about 300° C. In some embodiments, the ash produced by the ashing process may be removed using a gas stream (for example, but not limited to, a stream of oxygen gas, nitrogen gas, hydrogen gas, or the like). Referring to the example illustrated in FIG. 5, the interconnect openings 31 penetrate through the ILD layer 30 so as to expose the first interconnect structures 21 through the interconnect openings 31, respectively. Each of the interconnect openings 31 is formed with a tapered profile, which has an opening with dimensions gradually increasing in an upward direction, due to process variations, such as variations of operation parameters (for example, but not limited to, temperature, voltage, or the like) of a manufacturing apparatus of the semiconductor device. Each of the interconnect openings 31 has a sidewall surface 311 and a bottom surface 312.

Figure 6:
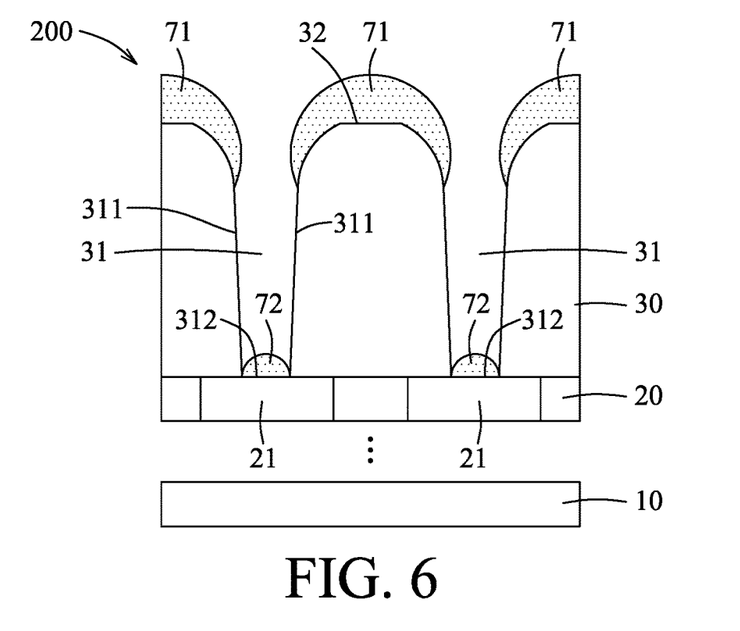
Figure 7:
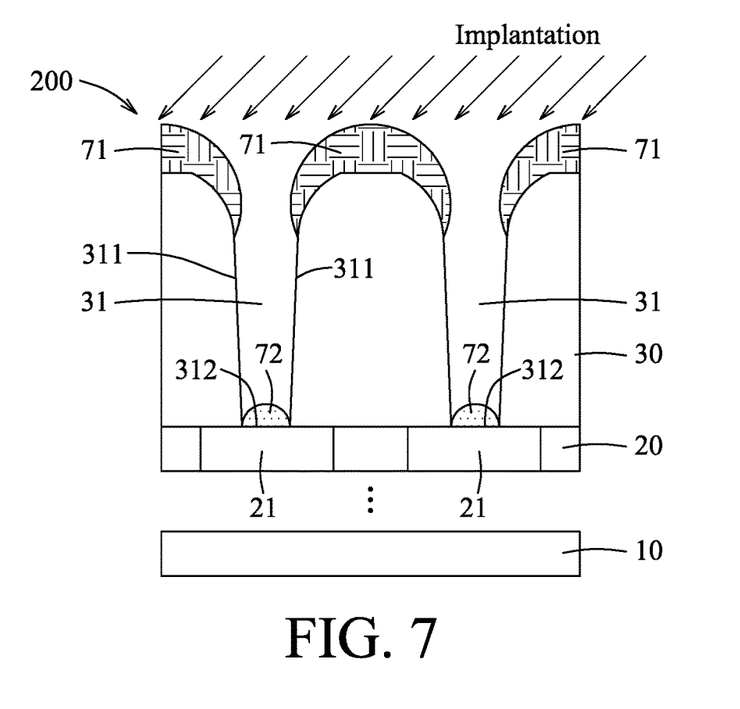
Figure 8:
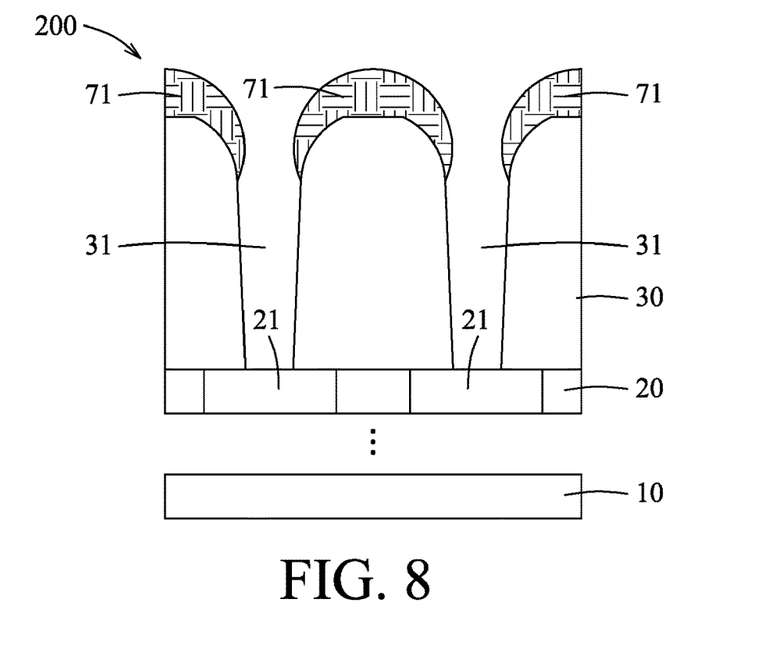
Figure 9:
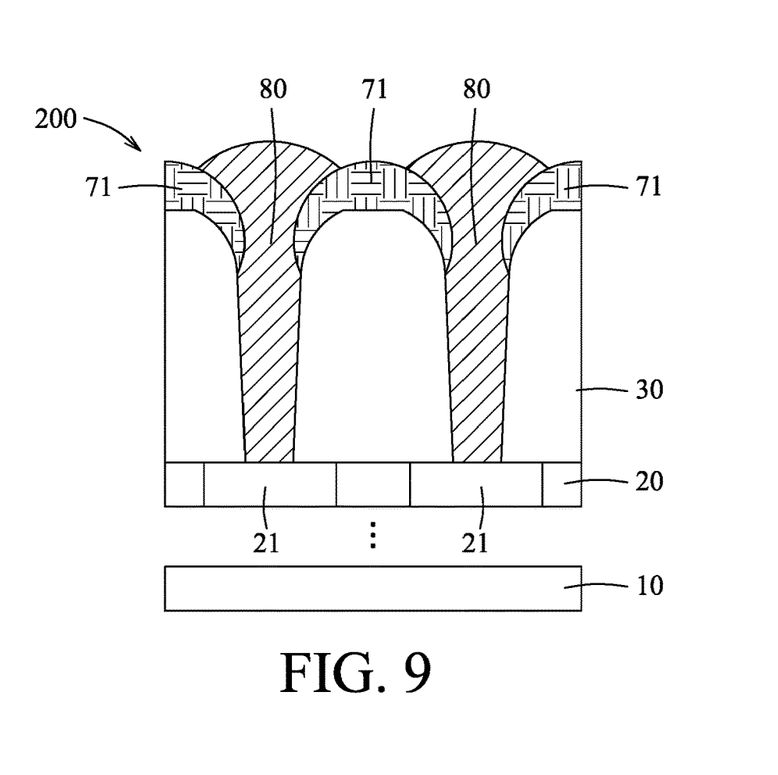

Referring to FIG. 1 and the examples illustrated in FIGS. 6 to 8, the method 100 proceeds to step 105, where an opening-adjustment process is conducted. An opening-adjustment process is conducted to adjust the profiles of the interconnect openings 31 of the ILD layer 30. In some embodiments, the opening-adjustment process includes the following steps.

Referring to the example illustrated in FIG. 6, a first film 71 and a second film 72 are formed at the same time using a deposition material by a suitable deposition process as is known in the art of semiconductor fabrication, such that the first film 71 is disposed on an upper surface 32 of the ILD layer 30 and extends into the interconnect openings 31 to cover an upper portion of the sidewall surface 311 of each of the interconnect openings 31 and such that the second film 72 is disposed on the bottom surface 312 of each of the interconnect openings 31. In some embodiments, the deposition process may include an anisotropic deposition process, for example, but not limited to, plasma vapor deposition, or the like. Other suitable deposition techniques are within the contemplated scope of the present disclosure. In some embodiments, the deposition material for forming the first and second films 71, 72 may include silicon, germanium, silicon oxide, silicon nitride, silicon carbide, silicon oxycarbide, silicon oxynitride, silicon carbonitride, silicon oxycarbonitride, or combinations thereof. Other suitable materials are within the contemplated scope of the present disclosure. In some embodiments, the first film 71 has a thickness which is greater than that of the second film 72 and which depends on the required dimensions of the interconnect openings 31. In some embodiments, the first film 71 has a thickness ranging from about 1 nanometer (nm) to about 20 nm.

Referring to the example illustrated in FIG. 7, an implantation process is conducted using a dopant precursor to implant a dopant into the first film 71 so as to permit the first film 71 to be doped with the dopant to form a doped film which has an etch selectivity different from that of the second film 72. In some embodiments, the dopant precursor used for the implantation process may include a boron-containing precursor, such that the first film 71 is doped with boron by the implantation process. In some embodiments, the boron-containing precursor may include, for example, but not limited to, boron halide (for example, but not limited to, boron fluoride ($BF_3$), boron chloride ($BCl_3$), or the like). Other suitable dopant precursors are within the contemplated scope of the present disclosure. In some embodiments, the implantation process is conducted at an implant energy ranging from about 0.5 KeV to about 2.0 KeV. If the implantation process is conducted at an implant energy greater than 2.0 keV, the features and/or components (for example, but not limited to, the ILD layer 30) proximate to the first film 71 may be damaged. In some embodiments, the implantation process is conducted at a tilt angle ranging from about 15° to about 90°. The tile angle represents an angle between an incidence direction of an ion beam and a normal axis to a plane of the first interconnect layer 20. If the implantation process is conducted at a tilt angle less than 15°, the second film 72 would be undesirably doped with the dopant. In some embodiments, the implantation process is conducted at a dosage concentration ranging from about $1.0 \times 10^{14}$ atoms/cm$^3$ to about $9.9 \times 10^{16}$ atoms/cm$^3$. If the implantation process is conducted at a dosage concentration of less than $1.0 \times 10^{14}$ atoms/cm$^3$, the first film 71 would not be doped with the dopant effectively, and may not have an etch selectively different from that of the second film 72.

Referring to the examples illustrated in FIGS. 7 and 8, a selective etching process is conducted by using an etching composition which has a higher etch selectivity to the second film 72 relative to the first film 71 and the dielectric portions 32 so as to selectively remove the second film 72 from the first interconnect layer 20. In some embodiments, the selective etching process is conducted using a selective wet etching process. In some embodiments, the selective etching process is conducted at a temperature ranging from about 25° C. to about 70° C. If the selective etching process is conducted at a temperature less than 25° C., the selective etching process would be conducted at an undesirably low etching rate. If the selective etching process is conducted at a temperature greater than 70° C., the temperature control of the apparatus for conducting the selective etching process would be difficult. In some embodiments, the selective etching process is conducted at a time period ranging from about 1 minute (min) to about 5 min. If the selective etching process is conducted at a time period less than 1 min, the second film 72 would not be removed completely. In some embodiments, the etching composition is an aqueous solution including an alkali chemical etchant and a buffer chemical. In some embodiments, the alkali chemical etchant in the etching composition has a concentration ranging from about 1% to about 40%. If the concentration of the alkali chemical etchant is less than 1%, the selective etching process would not be conducted effectively and the time period for conducting the selective etching process would be increased undesirably. In some embodiments, the alkali chemical etchant may include ammonium hydroxide ($NH_4OH$), tetramethyl ammonium hydroxide (TMAH), water soluble amine, or the like, or combinations thereof. Other suitable chemical etchants are within the contemplated scope of the present disclosure. In some embodiments, the buffer chemical may include ammonium halide (for example, but not limited to, ammonium fluoride, ammonium chloride, or the like), or the like. Other suitable buffer chemicals are within the contemplated scope of the present disclosure.

Referring to the example illustrated in FIG. 8, the first film 71 doped with the dopant remains on the ILD layer 30 to serve as a passivation layer, such that the profiles of the interconnect openings 31 are adjusted by decreasing the opening dimensions of the upper portions of the interconnect openings 31.

Referring to FIG. 1 and the examples illustrated in FIGS. 8 to 10 and 13, the method 100 proceeds to step 106, where a second interconnect layer including a plurality of second interconnect structures is formed. A conductive material 80 is filled into the interconnect openings 31 using a suitable deposition process as is known to those skilled in the art of semiconductor fabrication, for example, but not limited to, selective or non-selective PVD, selective or non-selective CVD, selective or non-selective PECVD, selective or non-selective ALD, selective or non-selective PEALD, electroless deposition (ELD)), or the like. In some embodiments, the conductive material 80 may include, for example, but not limited to, metals (e.g., copper (Cu), silver (Ag), gold (Au), aluminum (Al), nickel (Ni), cobalt (Co), ruthenium (Ru), iridium (Ir), platinum (Pt), palladium (Pd), osmium (Os), tungsten (W), molybdenum (Mo), tantalum (Ta), or the like), alloys thereof possessing promising conductive properties, or the like. Other suitable metal materials are within the contemplated scope of the present disclosure. In some embodiments, a barrier layer and a liner layer (not shown) may be deposited sequentially in the interconnect openings 31 before the conductive material 80 is filled into the interconnect openings 31, such that the liner layer is disposed between the barrier layer and the conductive material 80. The conductive material 80 serves as a bulk metal region. The barrier layer prevents the conductive material 80 from diffusing into the ILD layer 30. The liner layer enhances gap-filling of the conductive material 80 into the interconnect openings 31. In some embodiments, The barrier layer may include, for example, but not limited to, tantalum (Ta), zinc (Zn), manganese (Mn), zirconium (Zr), titanium (Ti), hafnium (Hf), niobium (Nb), vanadium (V), chromium (Cr), scandium (Sc), yttrium (Y), silicon (Si), tungsten (W), molybdenum (Mo), aluminum (Al), or the like suitable for forming a metal barrier layer, or combinations thereof. Other suitable materials are within the contemplated scope of the present disclosure. In some embodiments, the barrier layer may be formed using a suitable deposition process as is known to those skilled in the art of semiconductor fabrication, for example, but not limited to, PVD, CVD, PECVD, ALD, PEALD, or the like. Other suitable deposition processes are within the contemplated scope of the present disclosure. In some embodiments, the liner layer may include, for example, but not limited to, cobalt (Co), ruthenium (Ru), tantalum (Ta), or the like suitable for forming a metal liner layer. Other suitable metal materials are within the contemplated scope of the present disclosure. In some embodiments, the liner layer may be formed using a suitable deposition process as is known to those skilled in the art of semiconductor fabrication, for example, but not limited to, PVD, CVD, PECVD, ALD, PEALD, or the like. Other suitable deposition processes are within the contemplated scope of the present disclosure. A planarization process (for example, but not limited to, a chemical mechanical planarization (CMP) process) is then performed to remove excess of the conductive material 80 and portions of the first film 71 over the ILD layer 30 so as to form a second interconnect layer 90 disposed on the first interconnect layer 20. The second interconnect layer 90 includes a plurality of second interconnect structures 91 spaced apart from each other and penetrating through the ILD layer 30 to be electrically connected to the first interconnect structures 21, respectively. A plurality of dielectric insulators 711 doped with the dopant are formed on an upper portion of the ILD layer 30. Each of the dielectric insulators 711 is disposed to surround an upper portion of a corresponding one of the second interconnect structures 91 and to separate the upper portion of the corresponding one of the second interconnect structures 91 from the ILD layer 30. Upper portions of two adjacent ones of the second interconnect structures 91 are separated from each other by two corresponding ones of the dielectric insulators 711 and a portion of the ILD layer 30 disposed between the two corresponding ones of the dielectric insulators 711. In some embodiments, dielectric insulators 711 has a thickness ranging from about 1 nm to about 20 nm.

Figure 10:
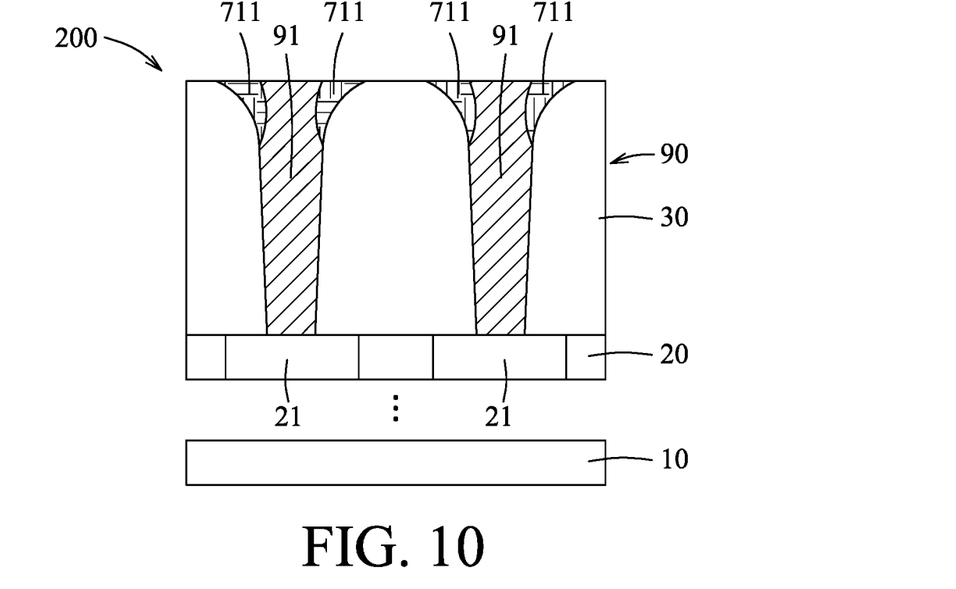
Figure 11:
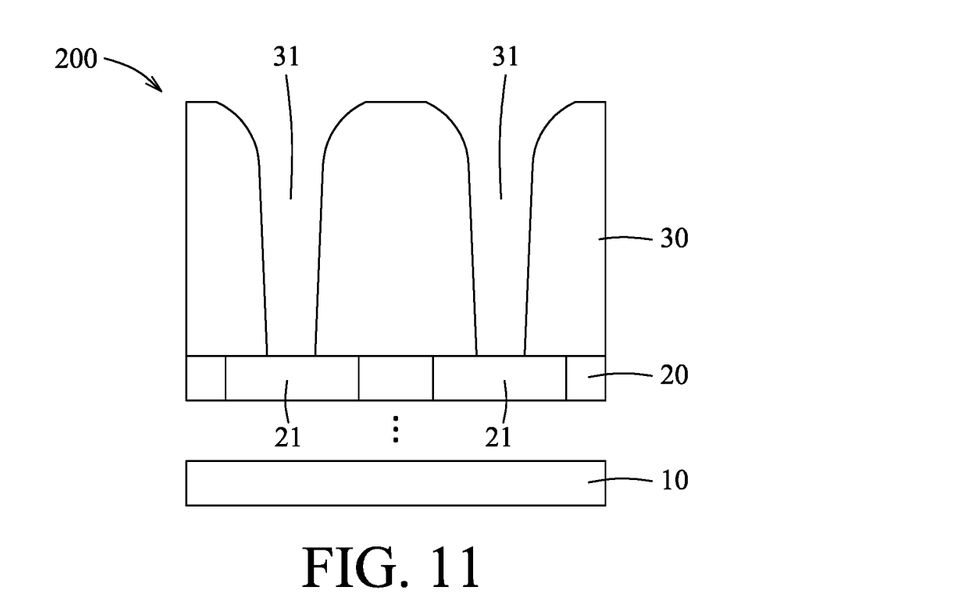
FIG. 11 is a schematic view illustrating profiles of interconnect openings which are not adjusted by an opening-adjustment process.
Figure 12:
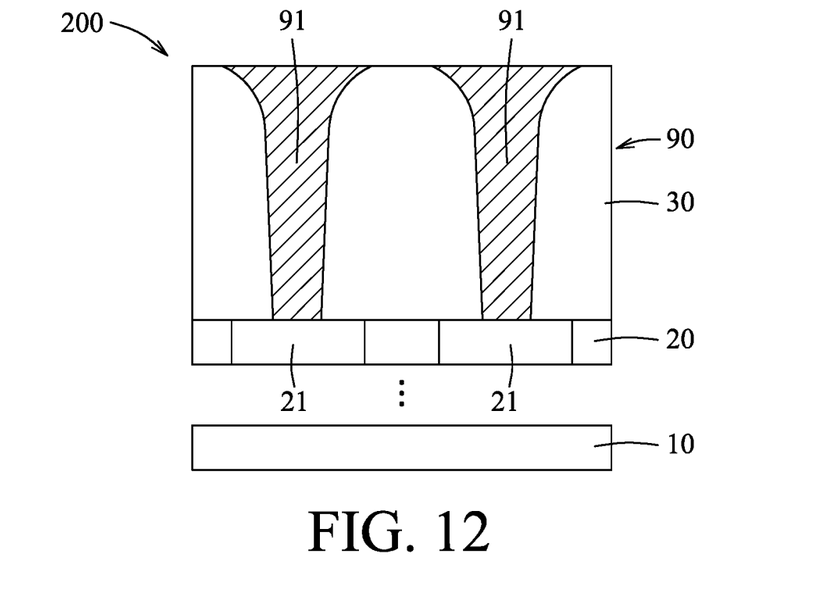
FIG. 12 is a schematic view illustrating profiles of interconnect structures formed from the interconnect openings illustrated in FIG. 11.

Referring to the configurations illustrated in FIGS. 11 and 12, the profiles of the upper portions of the interconnect openings 31 formed in the ILD layer 30 are not adjusted by forming the first film 71, which is doped with the dopant, on the ILD layer 30, as illustrated in FIG. 8. Upper portions of two adjacent ones of the interconnect structures 91 thus formed in the configuration illustrated in FIG. 12 are separated from each other merely by a portion of the ILD layer 30 disposed between the two adjacent ones of the interconnect structures 91. That is, the upper portions of two adjacent ones of the interconnect structures 91 are not separated from each other by two corresponding ones of the dielectric insulators 711, which respectively surround the upper portions of the interconnect structures 91, and a portion of the ILD layer 30, which is disposed between the two corresponding ones of the dielectric insulators 711, as illustrated in FIG. 10. Compared to the configuration illustrated in FIG. 12, in the configuration illustrated in FIG. 10, the profiles of the interconnect structures 91 are improved by forming the dielectric insulators 711 to surround the upper portions of the second interconnect structures 91. Therefore, the upper portions of two adjacent ones of the interconnect structures 91 are spaced apart from each other by a relatively large distance and a bridging risk to cause a short circuit between the interconnect structures 91 may be alleviated or eliminated.

Referring to the example illustrated in FIG. 14, a transistor 11 (for example, but not limited to, a fin field effect transistor (FinFET)) is formed on the substrate 10, and includes a pair of source/drain regions 111, a channel region 112, and a gate structure 113. One of the source/drain regions 111 serves as a source electrode, and the other of the source/drain regions 111 serves as a drain electrode. The channel regions 112 is disposed to interconnect the source/drain regions 111 to each other. The gate structure 113 is disposed on the channel region 112. A plurality of metal contacts 12 are disposed on the source/drain regions 111, respectively. The second interconnect layer 90 serves as a via layer, and the second interconnect structures 91 serve as via contacts. Each of the source/drain regions 111 is electrically connected to a corresponding one of the second interconnect structures 91 trough a corresponding one of the metal contacts 12. The gate structure 113 is electrically connected to a corresponding one of the second interconnect structures 91.

Figure 15:
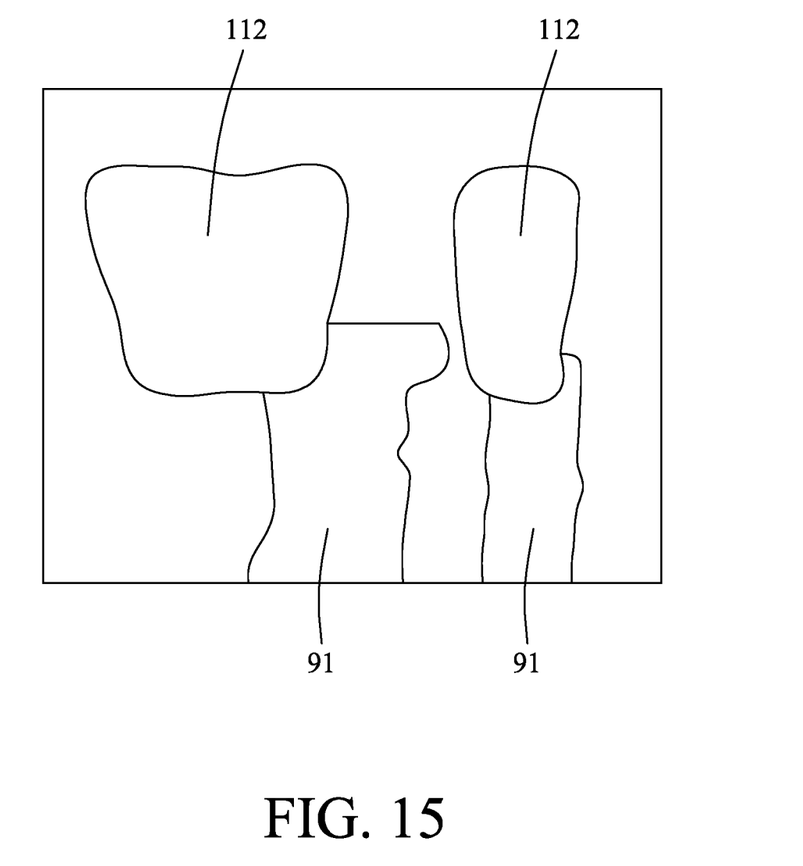
FIG. 15 is a fragmentary view illustrating profiles of interconnect structures formed at an intermediate stage of the method as depicted in FIG. 1 in accordance with some embodiments.

Referring to FIG. 1 and the examples illustrated in FIGS. 14 and 15, the method 100 proceeds to step 107, where a third interconnect layer is formed on the second interconnect layer. FIG. 14 is a schematic perspective view illustrating formation of a third interconnect layer 110 on the second interconnect layer 90. The third interconnect layer 110 includes an ILD layer 111 disposed on the second interconnect layer 90, and a plurality of third interconnect structures 112 extending upwardly from the second interconnect layer 90 and spaced apart from each other. Each of the third interconnect structures 112 penetrates through the ILD layer 111 to be electrically connected to a corresponding one of the second interconnect structures 91 in the second interconnect layer 90. In some embodiments, the third interconnect structures 112 may be formed by a single damascene process. In some embodiments, formation of the third interconnect structures 112 includes the following steps. First, a plurality of interconnect openings 113 are formed to penetrate through the ILD layer 111 so as to expose the corresponding ones of the second interconnect structures 91 from the interconnect openings 113, respectively. After formation of the interconnect openings 113, the third interconnect structures 112 are formed by depositing a conductive material to fill the interconnect openings 113 and then removing excess of the conductive material over the ILD 111 by a planarization technique, such as CMP. In some embodiments, the conductive material for forming the third interconnect structures 112 may include, for example, but not limited to, metals (e.g., Cu, Ag, Au, Al, Ni, Co, Ru, Ir, Pt, Pd, Os, W, Mo, Ta, or the like), alloys thereof possessing promising conductive properties, or the like. Other suitable metal materials are within the contemplated scope of the present disclosure. In some embodiments, the conductive material for forming the third interconnect structures 112 may be filled into the interconnect openings 113 using a suitable deposition process as is known to those skilled in the art of semiconductor fabrication, for example, but not limited to, selective or non-selective PVD, selective or non-selective CVD, selective or non-selective PECVD, selective or non-selective ALD, selective or non-selective PEALD, electroless deposition (ELD)), or the like. Other suitable deposition processes are within the contemplated scope of the present disclosure. In some embodiments, a barrier layer and a liner layer (not shown) may be deposited sequentially in the interconnect openings 113 before the conductive material is filled into the interconnect openings 113, such that the liner layer is disposed between the barrier layer and the conductive material. The conductive material serves as a bulk metal region. The barrier layer prevents the conductive material from diffusion into the ILD layer 111. The liner layer enhances gap-filling of the conductive material into the interconnect openings 113. Examples of the materials for the barrier layer and the liner layer of the third interconnect structures 112 may be the same as or similar to those for the barrier layer and the liner layer of the second interconnect structures 91 described above, and the details thereof are omitted for the sake of brevity.

In a method for manufacturing a semiconductor device of the present disclosure, profiles of interconnect openings formed in an ILD layer are adjusted by forming a doped film using an opening-adjustment process, which includes an anisotropic deposition process (for example, but not limited to, plasma vapor deposition, or the like). The doped film is disposed on the ILD layer and extends into the interconnect openings to cover an upper portion of a sidewall surface of each of the interconnect openings. The doped film can be used as a tuning knob to control the critical dimension of the interconnect openings. Upper portions of two adjacent ones of interconnect structures, which are formed by filling a conductive material into the interconnect openings, are separated from each other by two corresponding ones of doped dielectric insulators, which are formed from the doped film and which surrounds upper portions of the two adjacent ones of the interconnect structures, and a portion of the ILD layer, which is disposed between the two corresponding ones of the doped dielectric insulators, such that profiles of the interconnect structures are improved. Therefore, the upper portions of two adjacent ones of the interconnect structures are spaced apart from each other by a relatively large distance and a bridging risk to cause a short circuit between the interconnect structures may be alleviated or eliminated.

In accordance with some embodiments of the present disclosure, a method for manufacturing a semiconductor device includes: forming a patterned dielectric layer over a substrate, the patterned dielectric layer including an interconnect opening having a sidewall surface and a bottom surface; and forming a doped film by an opening-adjustment process, the doped film being disposed on the patterned dielectric layer and extending into the interconnect opening to cover an upper portion of the sidewall surface, so as to adjust a profile of the interconnect opening.

In accordance with some embodiments of the present disclosure, the method for manufacturing a semiconductor device further includes: filling a conductive material into the interconnect opening; and removing excess of the conductive material and a portion of the doped film over the patterned dielectric layer to form an interconnect structure and a doped dielectric insulator surrounding an upper portion of the interconnect structure such that the upper portion of the interconnect structure is separated from the patterned dielectric layer by the doped dielectric insulator.

In accordance with some embodiments of the present disclosure, the opening-adjustment process includes: forming a first film and a second film using a deposition material such that the first film is disposed on an upper surface of the patterned dielectric layer and extends into the interconnect opening to cover the upper portion of the sidewall surface of the interconnect opening and such that the second film is disposed on the bottom surface of the interconnect opening; implanting a dopant into the first film by an implantation process so as to form the first film into the doped film which has an etch selectivity different from that of the second film; and removing the second film using a selective etching process.

In accordance with some embodiments of the present disclosure, the first and second films are formed by an anisotropic deposition process.

In accordance with some embodiments of the present disclosure, the deposition material includes silicon, germanium, silicon oxide, silicon nitride, silicon carbide, silicon oxycarbide, silicon oxynitride, silicon carbonitride, silicon oxycarbonitride, or combinations thereof.

In accordance with some embodiments of the present disclosure, the implantation process is conducted using a boron-containing precursor such that the doped film formed by the implantation process includes boron as a dopant.

In accordance with some embodiments of the present disclosure, the implantation process is conducted at an implant energy ranging from 0.5 KeV to 2.0 KeV.

In accordance with some embodiments of the present disclosure, the implantation process is conducted at a tilt angle ranging from 15° to 90°.

In accordance with some embodiments of the present disclosure, the implantation process is conducted a dosage concentration ranging from $1.0\times10^{14}$ atoms/cm$^3$ to $9.9\times10^{16}$ atoms/cm$^3$.

In accordance with some embodiments of the present disclosure, the selective etching process is conducted using an etching composition which includes an alkali chemical etchant and a buffer chemical.

In accordance with some embodiments of the present disclosure, the alkali chemical etchant in the etching composition has a concentration ranging from 1% to 40%.

In accordance with some embodiments of the present disclosure, the selective etching process is conducted at a temperature ranging from 25° C. to 70° C.

In accordance with some embodiments of the present disclosure, a method for manufacturing a semiconductor device includes: forming a patterned dielectric layer over a substrate, the patterned dielectric layer including a first interconnect opening and a second interconnect opening spaced apart from each other, each of the first and second interconnect openings including a sidewall surface and a bottom surface; forming a first film and a second film using a deposition material such that the first film is disposed on an upper surface of the patterned dielectric layer and extends into the first and second interconnect openings to cover an upper portion of the sidewall surface of each of the first and second interconnect openings and such that the second film is disposed on the bottom surface of each of the first and second interconnect openings; implanting a dopant into the first film by an implantation process so as to form the first film into a doped film which has an etch selectivity different from that of the second film; removing the second film using a selective etching process; filling a conductive material into the first and second interconnect openings; and removing excess of the conductive material and a portion of the doped film over the patterned dielectric layer to form a first interconnect structure, a second interconnect structure, a first doped dielectric insulator surrounding an upper portion of the first interconnect structure, and a second doped dielectric insulator surrounding an upper portion of the second interconnect structure, such that the upper portion of the first interconnect structure is separated from the upper portion of the second interconnect structure by the first and second doped dielectric insulators and a portion of the dielectric layer disposed between the first and second doped dielectric insulators.

In accordance with some embodiments of the present disclosure, the first and second films are formed by an anisotropic deposition process.

In accordance with some embodiments of the present disclosure, the implantation process is conducted using a boron-containing precursor such that the doped film formed by the implantation process includes boron as a dopant.

In accordance with some embodiments of the present disclosure, the implantation process is conducted at an implant energy ranging from 0.5 KeV to 2.0 KeV.

In accordance with some embodiments of the present disclosure, the implantation process is conducted at a tilt angle ranging from 15° to 90°.

In accordance with some embodiments of the present disclosure, a semiconductor device includes a substrate and an interconnect layer disposed over the substrate. The interconnect layer includes a dielectric layer, an interconnect structure extending through the dielectric layer, and a doped dielectric insulator disposed to surround an upper portion of the interconnect structure, such that the interconnect structure is separated from the dielectric layer by the doped dielectric insulator.

In accordance with some embodiments of the present disclosure, the doped dielectric insulator includes boron as a dopant.

In accordance with some embodiments of the present disclosure, the doped dielectric insulator has a thickness ranging from 1 nm to 20 nm.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a patterned dielectric layer over a substrate, the patterned dielectric layer including an interconnect opening having a sidewall surface and a bottom surface; and
    forming a doped film by an opening-adjustment process, the doped film being disposed on the patterned dielectric layer and extending into the interconnect opening to cover an upper portion of the sidewall surface, so as to adjust a profile of the interconnect opening,
    wherein the opening-adjustment process includes:
    forming a first film and a second film using a deposition material such that the first film is disposed on an upper surface of the patterned dielectric layer and extends into the interconnect opening to cover the upper portion of the sidewall surface of the interconnect opening and such that the second film is disposed on the bottom surface of the interconnect opening;
    implanting a dopant into the first film by an implantation process so as to form the first film into the doped film which has an etch selectivity different from an etch selectivity of the second film; and
    removing the second film using a selective etching process.

2. The method according to claim 1, further comprising, after the opening-adjustment process:
    filling a conductive material into the interconnect opening; and
    removing excess of the conductive material and a portion of the doped film over the patterned dielectric layer to form an interconnect structure and a doped dielectric insulator surrounding an upper portion of the interconnect structure such that the upper portion of the interconnect structure is separated from the patterned dielectric layer by the doped dielectric insulator.

3. The method according to claim 1, wherein the first film and the second film are formed by an anisotropic deposition process.

4. The method according to claim 1, wherein the deposition material includes silicon, germanium, silicon oxide, silicon nitride, silicon carbide, silicon oxycarbide, silicon oxynitride, silicon carbonitride, silicon oxycarbonitride, or combinations thereof.

5. The method according to claim 1, wherein the implantation process is conducted using a boron-containing precursor such that the doped film formed by the implantation process includes boron as a dopant.

6. The method according to claim 1, wherein the implantation process is conducted at an implant energy ranging from 0.5 KeV to 2.0 KeV.

7. The method according to claim 1, wherein the implantation process is conducted at a tilt angle ranging from 15° to 90°.

8. The method according to claim 1, wherein the implantation process is conducted a dosage concentration ranging from $1.0 \times 10^{14}$ atoms/cm$^3$ to $9.9 \times 10^{16}$ atoms/cm$^3$.

9. The method according to claim 1, wherein the selective etching process is conducted using an etching composition which includes an alkali chemical etchant and a buffer chemical.

10. The method according to claim 9, wherein the alkali chemical etchant in the etching composition has a concentration ranging from 1% to 40%.

11. The method according to claim 1, wherein the selective etching process is conducted at a temperature ranging from 25° C. to 70° C.

12. The method according to claim 1, wherein an opening dimension of an upper portion of the interconnect opening is decreased by the opening-adjustment process.

13. A method for manufacturing a semiconductor device, comprising:
forming a patterned dielectric layer over a substrate, the patterned dielectric layer including a first interconnect opening and a second interconnect opening spaced apart from each other, each of the first interconnect opening and the second interconnect opening including a sidewall surface and a bottom surface;
forming a first film and a second film using a deposition material such that the first film is disposed on an upper surface of the patterned dielectric layer and extends into the first interconnect opening and the second interconnect opening to cover an upper portion of the sidewall surface of each of the first interconnect opening and the second interconnect opening and such that the second film is disposed on the bottom surface of each of the first interconnect opening and the second interconnect opening;
implanting a dopant into the first film by an implantation process so as to form the first film into a doped film which has an etch selectivity different from an etch selectivity of the second film;
removing the second film using a selective etching process;
filling a conductive material into the first interconnect opening and the second interconnect opening; and
removing excess of the conductive material and a portion of the doped film over the patterned dielectric layer to form a first interconnect structure, a second interconnect structure, a first doped dielectric insulator surrounding an upper portion of the first interconnect structure, and a second doped dielectric insulator surrounding an upper portion of the second interconnect structure, such that the upper portion of the first interconnect structure is separated from the upper portion of the second interconnect structure by the first doped dielectric insulator and the second doped dielectric insulator and a portion of the dielectric layer disposed between the first doped dielectric insulator and the second doped dielectric insulator.

14. The method according to claim 13, wherein the first film and the second film are formed by an anisotropic deposition process.

15. The method according to claim 13, wherein the implantation process is conducted using a boron-containing precursor such that the doped film formed by the implantation process includes boron as a dopant.

16. The method according to claim 13, wherein the implantation process is conducted at an implant energy ranging from 0.5 KeV to 2.0 KeV.

17. The method according to claim 13, wherein the implantation process is conducted at a tilt angle ranging from 15° to 90°.

18. A method for manufacturing a semiconductor device, comprising:
forming a patterned dielectric layer over a substrate, the patterned dielectric layer including a first interconnect opening and a second interconnect opening spaced apart from each other, each of the first interconnect opening and the second interconnect opening including a sidewall surface and a bottom surface and being formed with a tapered profile which has an opening with dimensions gradually increasing in an upward direction;
forming a first film and a second film using a deposition material such that the first film is disposed on an upper surface of the patterned dielectric layer and extends into the first interconnect opening and the second interconnect opening to cover an upper portion of the sidewall surface of each of the first interconnect opening and the second interconnect opening and such that the second film is disposed on the bottom surface of each of the first interconnect opening and the second interconnect opening;
implanting a dopant into the first film by an implantation process so as to form the first film into a doped film which has an etch selectivity different from an etch selectivity of the second film; and
removing the second film using a selective etching process, so as to make the doped film remain on the patterned dielectric layer to decease an opening dimension of an upper portion of each of the first interconnect opening and the second interconnect opening.

19. The method according to claim 18, wherein the first film and the second film are formed at the same time by an anisotropic deposition process.

20. The method according to claim 18, wherein the implantation process is conducted using a boron-containing precursor which includes boron halide.

* * * * *